United States Patent
Lin et al.

(10) Patent No.: US 6,614,708 B1
(45) Date of Patent: Sep. 2, 2003

(54) NON-VOLATILE MEMORY DEVICE WITH BUILT-IN LASER INDICATOR

(75) Inventors: Yu-Chuan Lin, Hsinchu County (TW); Chun-Chieh Chen, Tai-Nan County (TW); Hung-Ju Shen, Taipei County (TW); Tao-Chien Wei, Taipei (TW); Chien-Hua Wu, Miao-Li County (TW); Sheng-Lin Chiu, Nan-Tou County (TW); Huan-Tung Wang, Hsinchu County (TW); Hsin-Chih Hung, Yun-Lin County (TW)

(73) Assignee: Ritek Corporation, Hsinchu (TW)

( * ) Notice: Subject to any disclaimer, the term of this patent is extended or adjusted under 35 U.S.C. 154(b) by 0 days.

(21) Appl. No.: 10/065,567

(22) Filed: Oct. 31, 2002

(30) Foreign Application Priority Data

May 30, 2002 (TW) ...................................... 91207912 U

(51) Int. Cl.$^7$ ................................................ G11C 8/00
(52) U.S. Cl. ...................... 365/228; 365/229; 711/162; 714/14; 714/22
(58) Field of Search ........................ 365/185.01, 185.08, 365/226, 229, 228; 711/162, 161; 714/14, 22

(56) References Cited

U.S. PATENT DOCUMENTS

| | | | | |
|---|---|---|---|---|
| 5,596,708 A | * | 1/1997 | Weber | ............................ 714/6 |
| 6,181,630 B1 | * | 1/2001 | Caulkins | ...................... 365/228 |
| 6,336,174 B1 | * | 1/2002 | Li et al. | ...................... 711/162 |
| 6,473,355 B2 | * | 10/2002 | Caulkins | ...................... 365/228 |

* cited by examiner

Primary Examiner—Van Thu Nguyen
(74) Attorney, Agent, or Firm—Jiang Chyun IP Office

(57) ABSTRACT

A non-volatile memory device with a built-in laser indicator. The non-volatile memory device includes a connective port, a buffer, a non-volatile memory unit, a memory controller, a battery and a laser indicator. The connective port connects electrically to a host machine. The host machine transfers data and provides power to the connective port through an external bus. The buffer holds the data transmitted to the connective port temporarily. The memory controller controls the transfer of data from the buffer into the non-volatile memory unit. The battery receives host power and stores up some host power to serve as backup power. The battery also provides the power for driving the laser indicator.

34 Claims, 6 Drawing Sheets

NON-VOLATILE MEMORY DEVICE WITH BUILT-IN LASER INDICATOR

CROSS REFERENCE TO RELATED APPLICATIONS

This application claims the priority benefit of Taiwan application serial no.91207912,filed on May 13, 2002.

BACKGROUND OF THE INVENTION

1. Field of Invention

The present invention relates to a non-volatile memory device. More particularly, the present invention relates to a non-volatile memory device having a built-in laser indicator.

2. Description of Related Art

Through the popularization of electronic products, the upkeep and maintenance of digital data has become part of our daily activities. To facilitate the transfer of data, manufacturers have developed portable storage devices that use non-volatile memory as the main storage medium. The non-volatile memory device is capable of connecting to a host machine through various types of external bus interfaces such as the universal serial bus (USB) interface, the RS232 interface or the 1394 interface. Since the memory device is easy to carry and easy to connect to a host system, non-volatile memory devices now have widespread use.

However, most non-volatile memory devices have data-recording capability only. Although simple data can be immediately obtained from the non-volatile memory device if a user needs to provide a brief report, other indication devices such as a laser emitter are often required to indicate the data being explained. Since a laser emitter needs power to generate a light beam and focus the light beam onto a small region, frequent use of the laser emitter demands frequent change of the battery. For a user who needs to use the portable memory device in long conferences, standby batteries or rechargeable batteries and a battery charger must be carried around at all times causing great inconvenience.

SUMMARY OF THE INVENTION

Accordingly, one object of the present invention is to provide a non-volatile memory device having a built-in laser indicator such that the laser indicator can be powered by an energy source within the non-volatile memory device.

To achieve these and other advantages and in accordance with the purpose of the invention, as embodied and broadly described herein, the invention provides a non-volatile memory device with a built-in laser indicator. The device includes a connective port, a memory system, a power supply unit and a laser indicator. The connective port connects electrically with a host machine. The host machine passes data and provides power to the non-volatile memory device through an external bus on the connective port. The memory system holds data transmitted to the connective port temporarily before writing the data to the non-volatile memory device. The power supply unit is a storage device for electrical energy. When host power supplying the non-volatile memory device suddenly fails, the power supply unit provides back up power to write all received data into the non-volatile memory so that the data becomes readable. The laser indicator uses the power stored inside the power supply unit to produce light.

In one embodiment of this invention, the power supply unit also receives power from the host to charge up or regenerate the re-chargeable battery inside the power supply unit.

This invention also provides an alternative non-volatile memory device having a built-in laser indicator. The device includes a connective port, a buffer, a non-volatile memory, a memory controller, a battery and a laser indictor. The connective port connects electrically with a host machine. The host machine passes data and provides power to the non-volatile memory device through an external bus on the connective port. The buffer temporarily holds data transmitted to the connective port. The memory controller controls the transfer of data from the buffer to the non-volatile memory. The battery also receives power from the host. The laser indicator uses the power provided by the battery to produce light.

In one embodiment of this invention, the connective port has a configuration suitable for connecting with a universal serial bus (USB) interface, 1394 interface, RS232 interface, parallel transmission interface, personal computer multimedia card (PCMCIA) interface, flash memory card (CF) interface, secure digital memory card (SD) interface, multimedia memory card (MMC) interface or memory stick interface.

The non-volatile memory device not only has a built-in laser indicator, but also has a re-chargeable battery that can be charged during operation. Since a source of power is present to drive the laser indicator at all times, there is no need to carry extra batteries or to replace batteries from time to time.

In another embodiment of this invention, a detector may be installed to detect any variation in the power source. If power to the non-volatile memory device is cut off in the middle of a data writing operation, standby power may cut in to finish the writing operation. Furthermore, if power is suddenly lost in the middle of a file allocation table (FAT) update, the non-volatile memory device may use the standby power to finish the updating operation. Hence, stored data is rarely lost.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
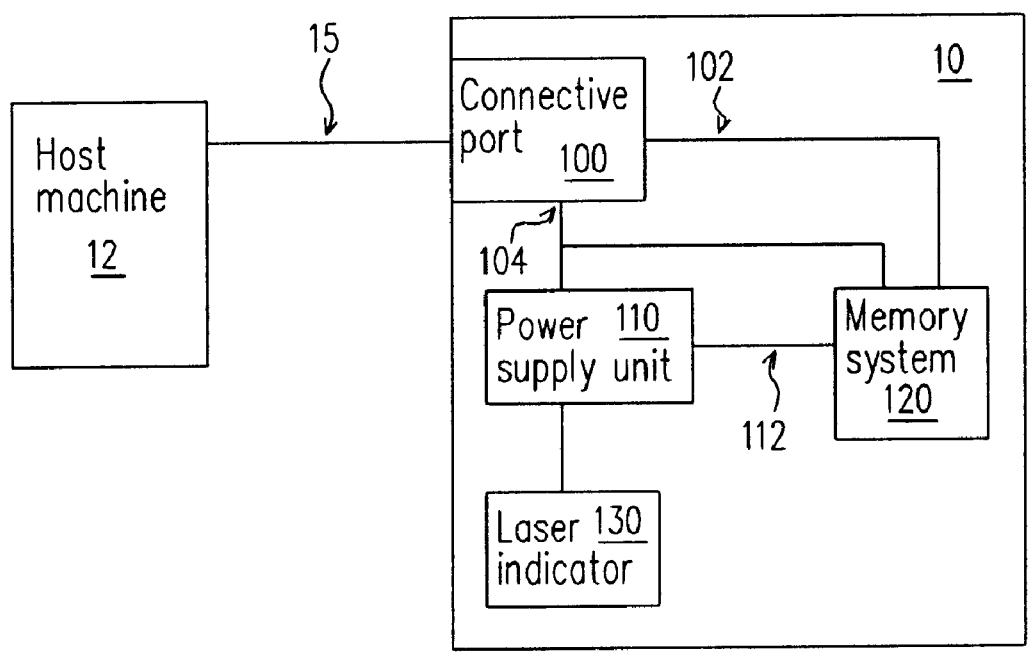
FIG. 1 is a block diagram of a non-volatile memory system according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a non-volatile memory system according to a first preferred embodiment of this invention. As shown in FIG. 1, the non-volatile memory device 10 of the system includes a connective port 100, a power supply unit 110, a memory system 120 and a laser indicator 130 (drawn not to scale). The connective port 100 exchanges signals with a host machine 12 through an external bus 15. Aside from sending data to the non-volatile memory device 10, the host machine 12 also provides power to drive the non-volatile memory device 10. Here, suitable external buses at least include the universal serial bus (USB) interface, 1394 interface, serial transmission (RS232) interface, parallel transmission interface, personal computer memory card (PCMCIA) interface, flash memory card (CF) interface, secure digital memory card (SD) interface, multimedia card (MMC) interface and memory stick interface. Correspondingly, the connecting port 100 must be designed with one of the interfaces in mind.

Figure 2:
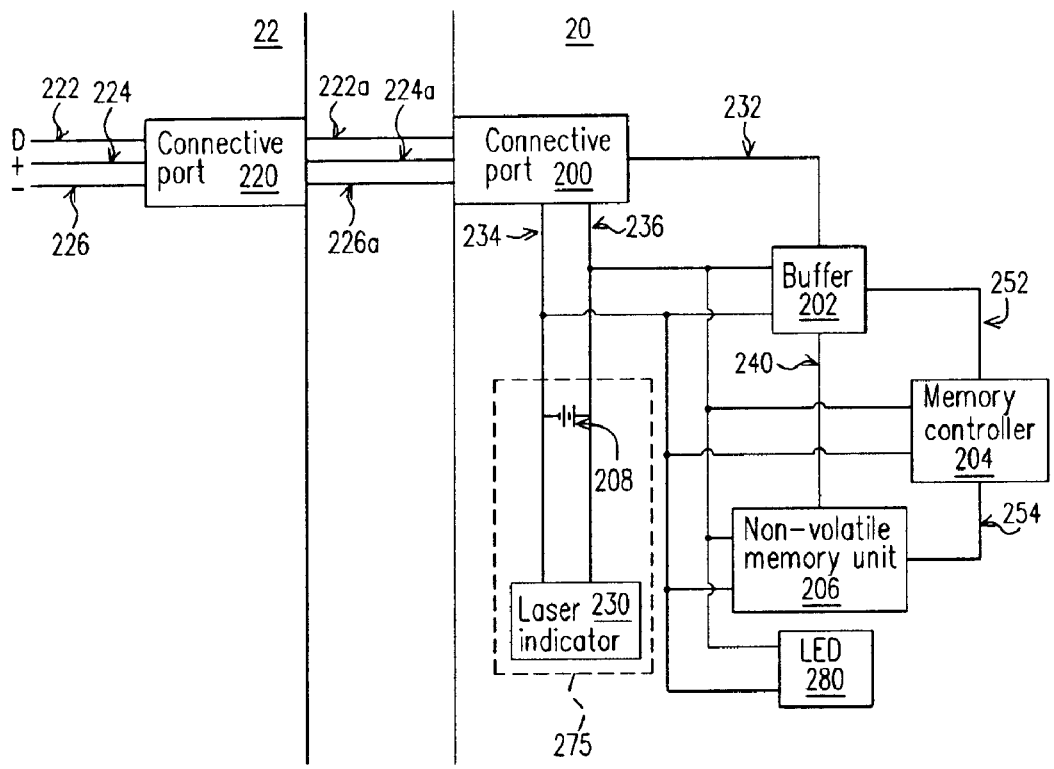
FIG. 2 is a circuit diagram of a non-volatile memory system according to a second preferred embodiment of this invention.

FIG. 2 is a circuit diagram of a non-volatile memory system according to a second preferred embodiment of this invention. As shown in FIG. 2, a connective port 220 on the host machine 22 receives internal data (D) through a data line 222 (in general, an internal bus). The connective port 220 also receives a host voltage through a pair of power lines 224 (+) and 226 (−). The data and host voltage are transmitted to a connective port 200 on the non-volatile memory device 20 through an external bus (having a data signal line 222a and a pair of power lines 224a and 226a). Power from the host machine 22 to the connective port 200 is re-directed to a buffer 202, a memory controller 204, a non-volatile memory unit 206, a block 275 and an LED 280 through a pair of power lines 234 and 236. Data transferred from the host machine to the connection port 200 is transferred through a data line 232 and temporarily stored inside the buffer 202. Thereafter, the data inside the buffer 202 is written into the non-volatile memory unit 206 under the direction of the memory controller 204.

The block 275 actually is comprised of a group of batteries 208 and a laser indicator 230. In general, the group of batteries 208 is a group of re-chargeable batteries so that the batteries 208 can be charged through the power provided by the host machine while the non-volatile memory device 20 is in operation. With this implementation, capacity of the batteries 208 for driving the laser indicator 230 is extended. In addition, the LED 280 may also indicate the amount of power remaining within the battery power by producing a different color for a different state.

Figure 3A:
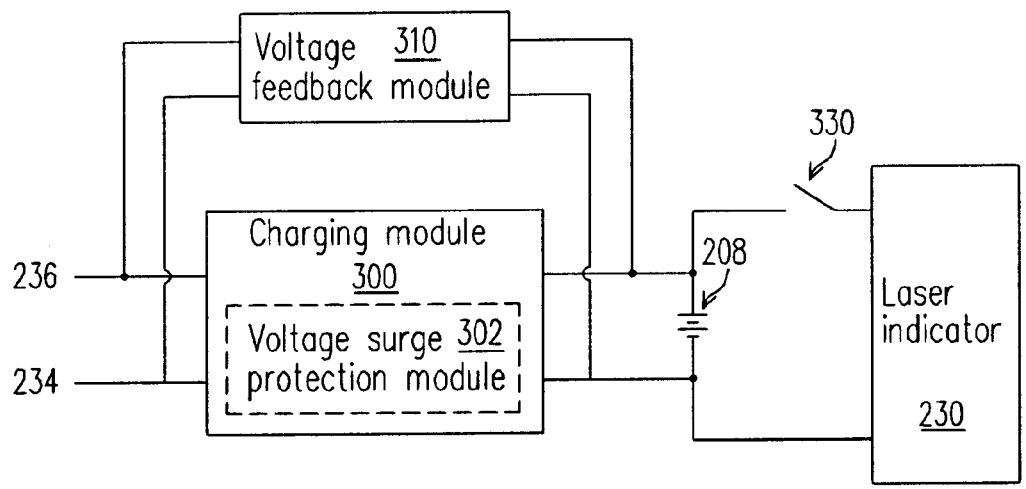
FIG. 3A is a circuit diagram showing in detail the arrangement of internal components and connections inside block 275 of FIG. 2.

FIG. 3A is a circuit diagram showing in detail the arrangement of internal components and connections inside block 275 of FIG. 2. Note that although host power is fed to the battery pack 208 through a charging module 300 under most conditions, the charging module 300 is not an essential element in this invention as shown in FIG. 2.

As shown in FIG. 3A, the charging module 300 further includes a power surge-protect module 302. When the host machine operates normally, power from the host will pass a current to the battery pack 208 through the charging module 300. In this embodiment, the laser indicator 230 is turned on or off through a switch 330. If the switch 330 is flipped to the "on" position, the battery pack 208 provides stored power to drive the laser indicator 230. Conversely, if the switch 330 is flipped to the "off" position, power to the laser indicator 230 is severed. This invention may also include a voltage feedback module 310 to detect a loss of host power. For example, when the host power is reduced gradually such that voltage across the power lines 234 and 236 drops to a threshold, the voltage feedback circuit 310 may redirect standby power to the power lines 234 and 236 so that the non-volatile memory device 20 continues to operate normally.

Figure 3B:
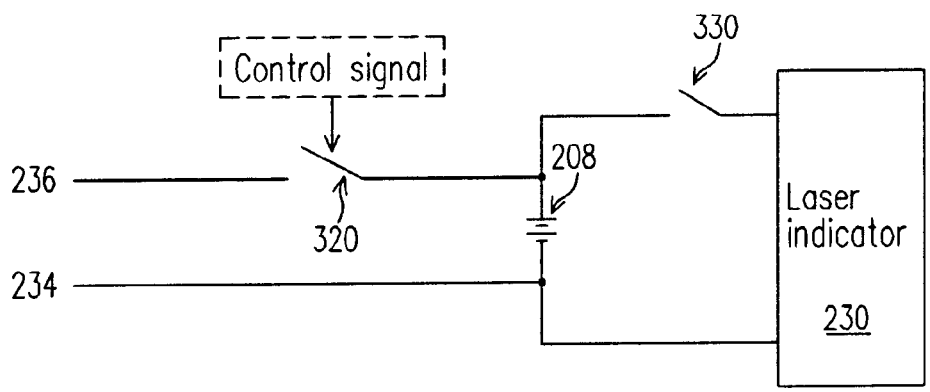
FIG. 3B is a circuit diagram showing in detail an alternative arrangement of the internal components and connections inside block 275 of FIG. 2.

FIG. 3B is a circuit diagram showing in detail an alternative arrangement of the internal components and connections inside block 275 of FIG. 2. Similar to FIG. 3A, the laser indicator 230 is powered by the battery pack 208. If the switch 330 is flipped to the "on" position, the battery pack 208 provides stored power to drive the laser indicator 230. Conversely, if the switch 330 is flipped to the "off" position, power to the laser indicator 230 is severed and the laser indicator 230 is turned off. However, in this embodiment; connection between the battery pack 208 and the pair of power lines 234 and 236 is controlled by another switch 320. The switch 320 has a terminal for receiving a control signal. The control signal may come from the memory controller 204, for example. Under normal operating conditions, the memory controller 204 turns the switch 320 "on" so that the battery pack 208 receives power from the host and replenishes any lost power. On the other hand, when power from the host is suddenly lost, the battery pack 208 provides power to the memory system (including the buffer 202, the memory controller 204 and the non-volatile memory unit 206) until all data writing operations are complete. Thereafter, the memory controller 204 signals to turn off the switch 320 so that the battery pack 208 now provides power to the laser indicator 230.

Since most external buses provide a voltage of about 5V, the memory system 120, the buffer 202, the memory controller 204 and the non-volatile memory unit 206 are capable of operating at 5V without incorporating any voltage regulator. However, anyone familiar with basic circuit design may include a voltage regulator so that the elements within the memory device can operate under non-standard voltages.

Figure 4A:
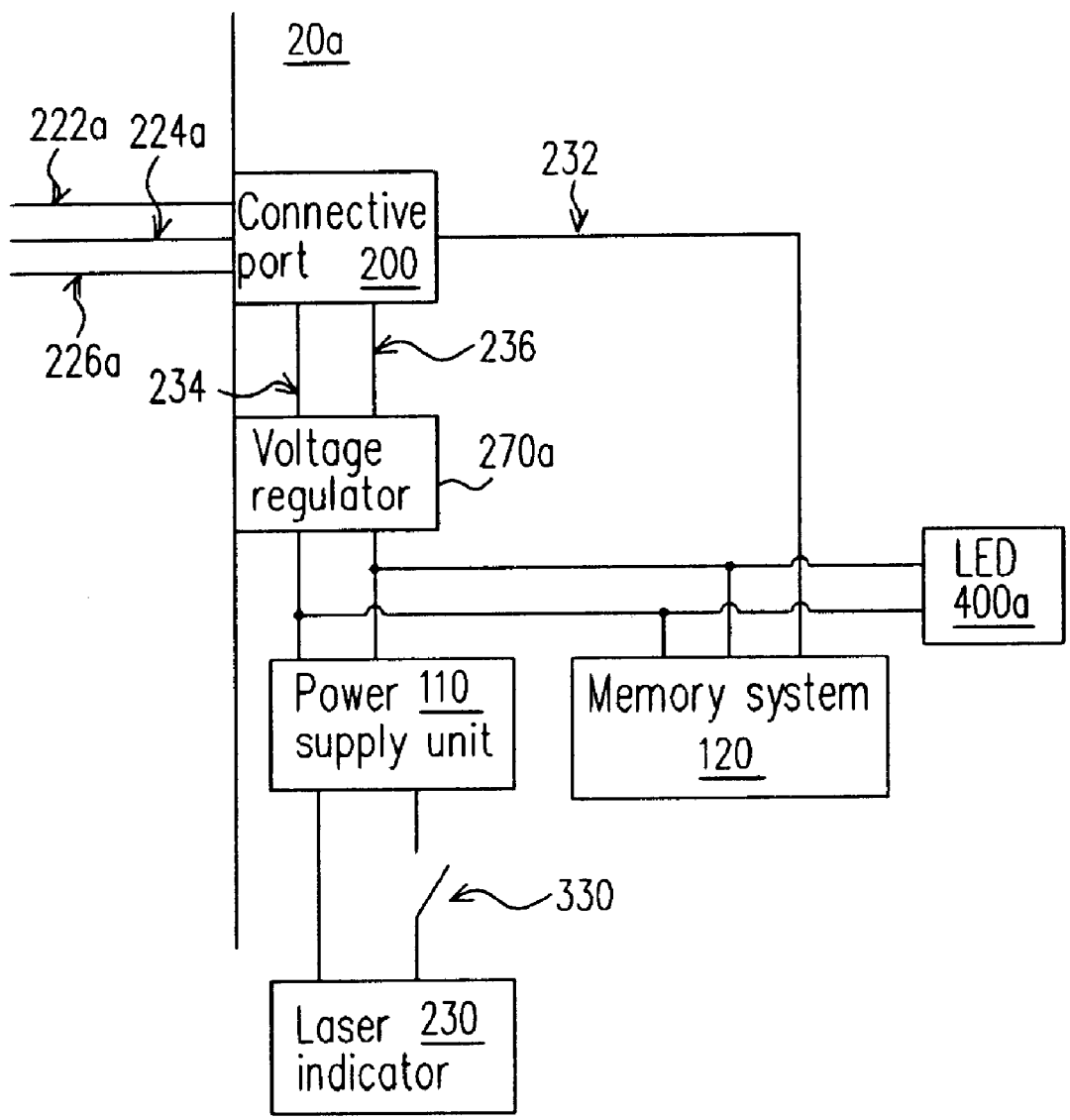
FIG. 4A is a circuit diagram of a non-volatile memory system according to a third preferred embodiment of this invention.
Figure 4B:
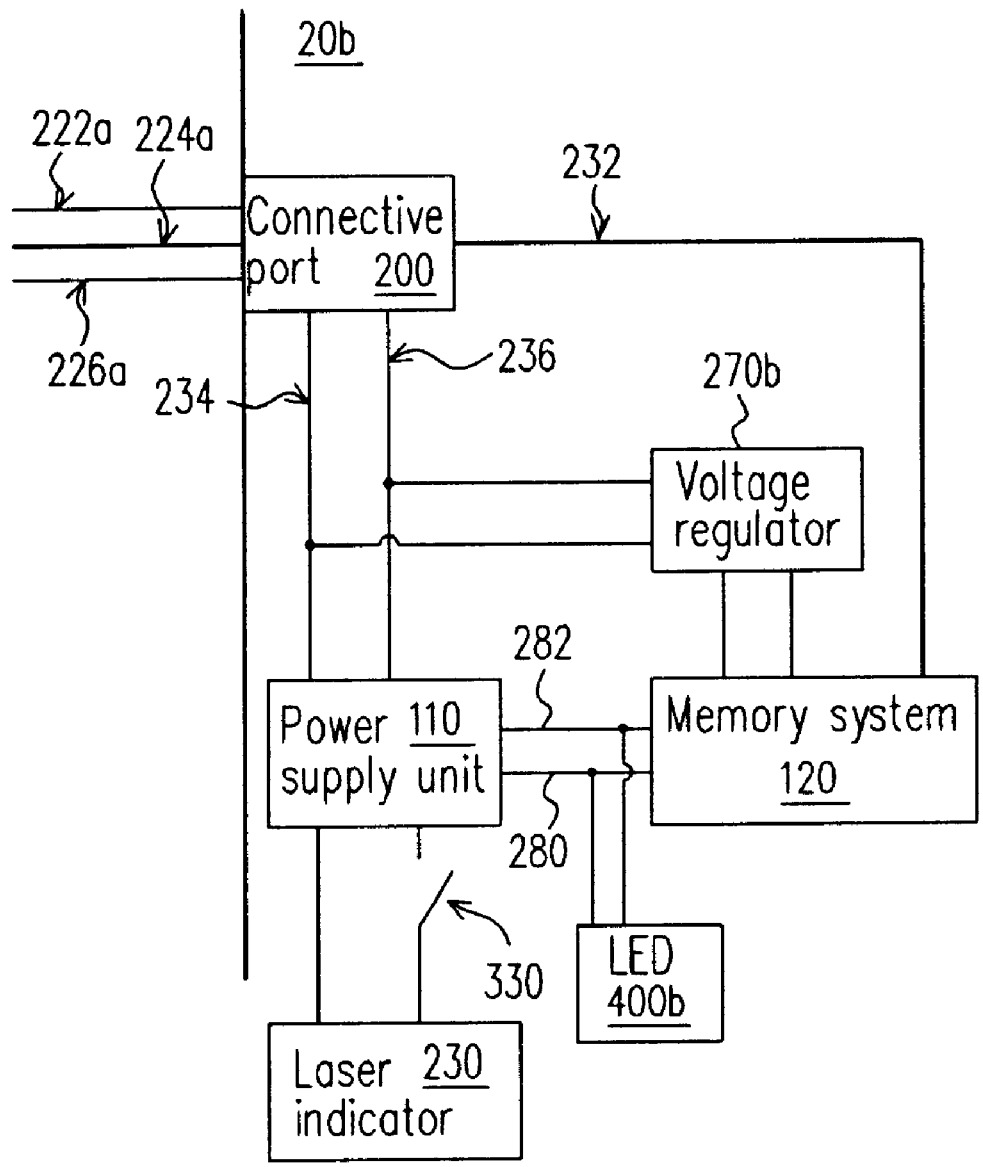
FIG. 4B is a circuit diagram of a non-volatile memory system according to a fourth, preferred embodiment of this invention.

FIGS. 4A and 4B are circuit diagrams of a non-volatile memory system having a voltage regulator therein according to this invention. In FIGS. 4A and 4B, the elements identical to the ones in FIGS. 1 and 2 are labeled identically. To simplify explanations, the buffer 202, the memory controller 204 and the non-volatile memory unit 206 in Fig. 2 are combined together to form a memory system similar to the one in FIG. 1. As shown in FIG. 4A, host power intercepted by the connective port 200 is first passed to a voltage regulator 270a. The voltage regulator 270a converts the host power into a form suitable for internal use, for example a voltage suitable for operating the memory system 120, the power supply unit 110 or the LED 400a. Thereafter, the converted host power is re-directed from the voltage regulator 270a to various internal units. Similarly, host power intercepted by the connective port 200 is re-directed to a voltage regulator 270b and a power supply unit 110 respectively as shown in FIG. 4B. The voltage regulator 270b converts the host power into a form suitable for operating the memory system 120. Aside from providing power to the laser indicator 230, the power supply unit 110 also provides power to the LED 400b and the memory system 120 through a pair of power lines 280 and 282.

Although the power supply unit 110 need not provide power to the memory system 120, this arrangement boosts overall efficiency of the system in this invention. In general, writing data into the memory system 120 may be divided into three stages. In the first stage, data is written into memory in batches. In the second stage, information related to the file is written into a file description block. Finally, in the third stage, the file allocation table (FAT) is updated so that a user may access the data in the file. Because a file description block includes main and associated filenames, attributes, reserves, time, date, indicator, size and other related data, any missing items may lead to incomplete storage. However, the information for the file allocation blocks cannot be written down until all the data are written into the file. If there is a power failure before all the data for a particular file is written into the file, data already written into the file cannot be accessed by a user.

Hence, this invention provides a power supply unit 110 as a standby power source so that all the data already transferred into the memory system 120 can be written into the file and the content of the file description blocks updated. With this arrangement, even if power is cut when the file is only partially transmitted, the non-volatile memory device 10 can still retain the transmitted portion of the data. Furthermore, if power is cut before the file allocation table is fully updated, content within the table may be inaccurate and some stored data may become inaccessible. The power supply unit 110 is able to prevent such errors by providing backup power to operate the non-volatile memory device until the file allocation table is fully updated.

Preferably, the memory system 120 is able to generate a control signal to control switching of the power supply unit 110. In general, when the host power is running normally, the power supply unit 110 has no need to provide power. When the host power suddenly fails and the memory system 120 still contains unwritten data or the file allocation table is not fully updated, the power supply unit 110 is the power source for completing the job.

In this invention, the presence or absence of host power may be monitored using pre-installed firmware inside the memory controller 204 or through the voltage feedback module 310 shown in FIG. 3. Furthermore, the battery pack 208 may react to the presence or absence of host power in a positive manner. The battery pack 208 reacts to power failure in the following manner (refer to FIG. 2).

When the host machine suddenly fails to provide power to the memory device for whatever reason or the external bus is improperly plugged into the non-volatile memory device 20, voltage across the power lines 234 and 236 will gradually drop. When the voltage across the power lines 234 and 236 drops below the voltage provided by the battery pack 208, the battery pack 208 will cut in as a standby power source replacing the original host power. Under such circumstances, the memory controller 204 may utilize battery power to transfer the temporarily stored data within the buffer into the non-volatile memory unit 206. After all data have been written into the file, data within the file description blocks are modified and finally the file allocation table is updated.

Aside from the basic response of the battery pack 208, pre-installed firmware within the memory controller 204 may also be used to detect any voltage fluctuation. When the memory controller 204 has transferred all the data within the buffer 202 into the non-volatile memory unit 206, modified the file description blocks and updated the file allocation table, power to the buffer 202, the memory controller 204 and the non-volatile memory unit 206 may be cut through the control signal lines 252 and 254 so that some energy is saved. In addition, anyone familiar with circuit design knows that further saving of electric power can be achieved through directly severing the power supply line from the battery pack 208. This is implemented through the controllable switch 320 whose control terminal is connected to the memory controller 204 as shown in FIG. 3B.

Anyone familiar with circuit design and the aforementioned concept may make some changes to the circuits. For example, as shown in FIG. 4B, the power provided by the power supply unit 110 may be converted inside the voltage regulator 270b before passing to the memory system 120. Hence, the aforementioned embodiments serve as illustration only and should by no means constrain the scope of this invention. In the non-volatile memory device having a voltage regulator therein, internal elements such as the memory system and the power supply unit need not operate at a voltage identical to the voltage provided by the host machine through the external bus. Therefore, various elements within the non-volatile memory device may be modified according to cost and circuit considerations.

To boost operating efficiency, a re-chargeable battery pack is preferably used as the power source inside the non-volatile memory device. Obviously, a non-re-chargeable battery such as button battery may also be used in this invention.

Figure 5:
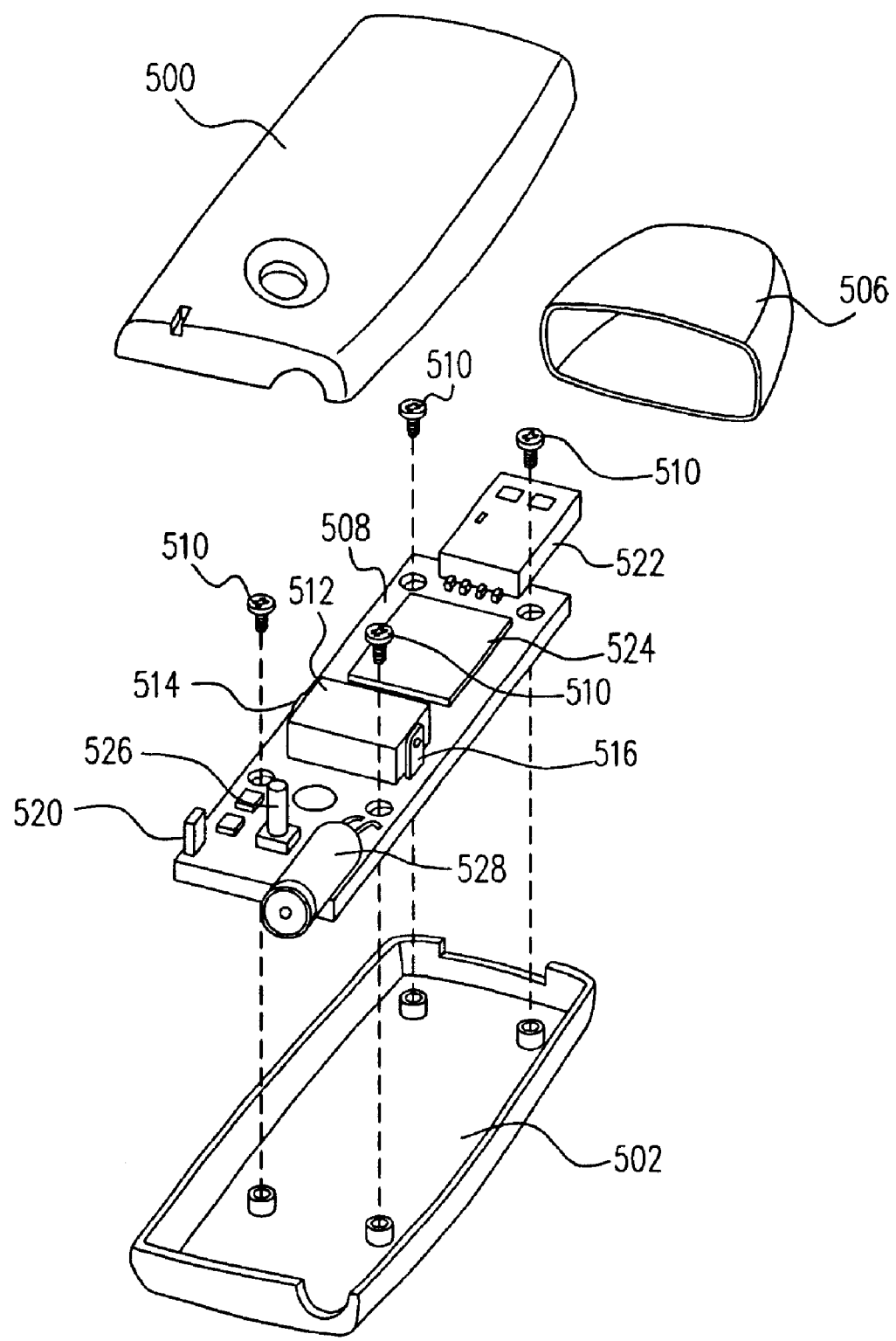
FIG. 5 is an explosion view of all the components constituting a non-volatile memory device according to the embodiment of this invention.

FIG. 5 is an explosion-view of all the components constituting a non-volatile memory device according to the embodiment of this invention. Through FIG. 5, anyone having some background in component manufacturing may fabricate various components and assemble them together to form the non-volatile memory device.

In conclusion, the non-volatile memory device of this invention obtains power from a host machine through an external bus. The non-volatile memory device uses external power to charge up a re-chargeable battery when the non-volatile memory device operates normally. In the presence of a re-chargeable battery, the laser indicator inside the memory device has a source of power. Hence, a user no longer has to carry batteries around. Even if a non-re-chargeable battery is used, the circuit design provides a convenient operating environment to the memory user. However, the most important aspect of this invention is the capacity to write data that has already been delivered to the memory device to the non-volatile memory unit through power provided by the internal power source. Consequently, none of the transmitted data are lost even if power from the host suddenly fails.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory device with built-in laser indicator comprising:
   a connective port electrically connected to a host machine, wherein the host machine transfers data and provides power to the non-volatile memory device through an external bus;
   a battery for providing standby power;
   a buffer for temporarily holding data picked up by the connective port;

a non-volatile memory unit;

a memory controller controlling the transfer of data from the buffer into the non-volatile memory unit and monitoring the presence of host power such that the standby power is triggered to complete the transfer of data into the non-volatile memory unit if the host power suddenly fails; and a laser indicator driven by standby power to emit light.

2. The non-volatile memory device with built-in laser indicator of claim 1, wherein the connective port is designed with a specification capable of connecting with an interface selected from a group consisting of universal serial interface, 1394 interface, serial transmission interface, parallel transmission interface, personal computer memory card interface, flash memory card interface, secure digital memory card interface, multimedia memory card interface and memory stick interface.

3. The non-volatile memory device with built-in laser indicator of claim 1, wherein the non-volatile memory device further includes a voltage feedback module for detecting the presence of host power and providing standby power to the buffer, the non-volatile memory unit and the memory controller when host power suddenly fails.

4. The non-volatile memory device with built-in laser indicator of claim 1, wherein the non-volatile memory device further includes a charging module that receives host power to charge up the battery.

5. The non-volatile memory device with built-in laser indicator of claim 4, wherein the charging module further includes a battery protection module that prevents the battery from voltage surge.

6. The non-volatile memory device with built-in laser indicator of claim 1, wherein the non-volatile memory device further includes a mechanical switch for re-directing standby power to the laser indicator on demand.

7. The non-volatile memory device with built-in laser indicator of claim 1, wherein the non-volatile memory device further includes a voltage regulator that converts the voltage from an external source to a voltage suitable for operating the buffer, the non-volatile memory unit and the memory controller.

8. The non-volatile memory device with built-in laser indicator of claim 1, wherein the non-volatile memory device further includes a power indicator capable of showing different signs when the battery is fully, partially or insufficiently charged.

9. The non-volatile memory device with built-in laser indicator of any one of the claims from 1 to 8, wherein the battery includes a non-re-chargeable battery.

10. The non-volatile memory device with built-in laser indicator of any one of the claims from 1 to 8, wherein the battery includes a re-chargeable battery.

11. A non-volatile memory device with a built-in laser indicator comprising:

a connective port electrically connected to a host machine, wherein the host machine transfers data and provides power to the non-volatile memory device through an external bus;

a memory system for temporarily holding data picked up by the connective port and writing the data into the a non-volatile memory unit;

a power supply unit for storing electric power, wherein the power supply unit is able to provide standby power, to complete the writing of data from the memory system to the non-volatile memory unit to become readable data, when host power suddenly fails; and a laser indicator driven by the power supply unit to emit light.

12. The non-volatile memory device with built-in laser indicator of claim 11, wherein the connective port is designed with a specification capable of connecting with an interface selected from a group consisting of universal serial interface, 1394 interface, serial transmission interface, parallel transmission interface, personal computer memory card interface, flash memory card interface, secure digital memory card interface, multimedia memory card interface and memory stick interface.

13. The non-volatile memory device with built-in laser indicator of claim 11, wherein the power supply unit further includes a charging module for receiving host power to charge up the power supply unit.

14. The non-volatile memory device with built-in laser indicator of claim 11, wherein the memory system uses the standby power provided by the power supply unit to complete the updating of a file allocation table when the host power fails suddenly in the middle of the updating operation.

15. The non-volatile memory device with built-in laser indicator of claim 11, wherein the non-volatile memory device further includes a switch for re-directing power from the power supply unit to the laser indicator on demand.

16. The non-volatile memory device with built-in laser indicator of claim 11, wherein the non-volatile memory device further includes a power indicator capable of showing different signs when the battery is fully, partially or insufficiently charged.

17. The non-volatile memory device with built-in laser indicator of claim 11, wherein the non-volatile memory device further includes a voltage regulator that converts the voltage from a host machine to a voltage suitable for operating the memory system.

18. The non-volatile memory device with built-in laser indicator of any one of the claims from 11 to 17, wherein the power supply unit includes a non-re-chargeable battery.

19. The non-volatile memory device with built-in laser indicator of any one of the claims from 11 to 17, wherein the power supply unit includes a re-chargeable battery.

20. A non-volatile memory device with a built-in laser indicator comprising:

a connective port electrically connected to a host machine, wherein the host machine transfers data and provides power to the non-volatile memory device through an external bus;

a battery for receiving host power;

a buffer for temporarily holding data picked up by the connective port;

a non-volatile memory unit;

a memory controller controlling the transfer of data from the buffer into the non-volatile memory unit; and a laser indicator driven by the battery to emit light.

21. The non-volatile memory device with built-in laser indicator of claim 20, wherein the connective port is designed with a specification capable of connecting with an interface selected from a group consisting of universal serial interface, 1394 interface, serial transmission interface, parallel transmission interface, personal computer memory card interface, flash memory card interface, secure digital memory card interface, multimedia memory card interface and memory stick interface.

22. The non-volatile memory device with built-in laser indicator of claim 20, wherein the non-volatile memory device further includes a switch for re-directing power from the battery to the laser indicator on demand.

23. The non-volatile memory device with built-in laser indicator of claim 20, wherein the non-volatile memory device further includes a voltage regulator that converts the voltage from a host machine to a voltage suitable for operating the buffer, the non-volatile memory unit and the memory controller.

24. The non-volatile memory device with built-in laser indicator of claim 20, wherein the non-volatile memory device further includes a power indicator capable of showing different signs when the battery is fully, partially or insufficiently charged.

25. The non-volatile memory device with built-in laser indicator of any one of the claims from 20 to 24, wherein the battery includes a non-re-chargeable battery.

26. The non-volatile memory device with built-in laser indicator of any one of the claims from 20 to 24, wherein the battery includes a re-chargeable battery.

27. A non-volatile memory device with a built-in laser indicator comprising:

a connective port electrically connected to a host machine, wherein the host machine transfers data and provides power to the non-volatile memory device through an external bus;

a memory system for temporarily holding data picked up by the connective port and writing the data into a non-volatile memory unit;

a power supply unit for receiving host power and holding backup power; and a laser indicator driven by the battery to emit light.

28. The non-volatile memory device with built-in laser indicator of claim 27, wherein the non-volatile memory device further includes a switch for re-directing power from the power supply unit to the laser indicator on demand.

29. The non-volatile memory device with built-in laser indicator of claim 27, wherein the connective port is designed with a specification capable of connecting with an interface selected from a group consisting of universal serial interface, 1394 interface, serial transmission interface, parallel transmission interface, personal computer memory card interface, flash memory card interface, secure digital memory card interface, multimedia memory card interface and memory stick interface.

30. The non-volatile memory device with built-in laser indicator of claim 27, wherein the power supply unit further includes a charging module that receives host power to charge the power supply unit.

31. The non-volatile memory device with built-in laser indicator of claim 27, wherein the non-volatile memory device further includes a voltage regulator that converts the voltage from a host machine to a voltage suitable for operating the memory system.

32. The non-volatile memory device with built-in laser indicator of claim 27, wherein the non-volatile memory device further includes a power indicator capable of showing different signs when the battery is fully, partially or insufficiently charged.

33. The non-volatile memory device with built-in laser indicator of any one of the claims from 27 to 32, wherein the battery includes a non-re-chargeable battery.

34. The non-volatile memory device with built-in laser indicator of any one of the claims from 27 to 32, wherein the battery includes a re-chargeable battery.

* * * * *